(12) United States Patent
Suresh et al.

(10) Patent No.: US 10,600,920 B2
(45) Date of Patent: Mar. 24, 2020

(54) SEMICONDUCTOR DEVICE

(71) Applicant: Nuvoton Technology Corporation, Hsinchu Science Park (TW)

(72) Inventors: Vinay Suresh, Bangalore (IN); Po-An Chen, Toufen (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/121,220

(22) Filed: Sep. 4, 2018

(65) Prior Publication Data
US 2019/0348545 A1 Nov. 14, 2019

(30) Foreign Application Priority Data
May 8, 2018 (TW) .............................. 107115562 A

(51) Int. Cl.
*H01L 29/808* (2006.01)
*H01L 29/417* (2006.01)
*H01L 29/08* (2006.01)
*H01L 29/06* (2006.01)

(52) U.S. Cl.
CPC ........ *H01L 29/808* (2013.01); *H01L 29/0692* (2013.01); *H01L 29/0843* (2013.01); *H01L 29/41758* (2013.01)

(58) Field of Classification Search
CPC ............... H01L 29/808; H01L 29/0692; H01L 29/1066; H01L 29/41758
See application file for complete search history.

(56) References Cited

U.S. PATENT DOCUMENTS

| | | | |
|---|---|---|---|
| 9,634,154 B1 * | 4/2017 | Lu | .......................... H01L 29/872 |
| 2009/0065888 A1 | 3/2009 | Kato et al. | |
| 2013/0334600 A1 | 12/2013 | Hsu et al. | |
| 2014/0306270 A1 | 10/2014 | Kim et al. | |
| 2015/0200309 A1 | 7/2015 | Karino et al. | |
| 2015/0325485 A1 | 11/2015 | Ng et al. | |
| 2016/0141418 A1 | 5/2016 | Yeh et al. | |
| 2016/0181369 A1 | 6/2016 | Ning et al. | |
| 2016/0293758 A1 | 10/2016 | Kim et al. | |
| 2017/0005205 A1 | 1/2017 | Chan et al. | |
| 2017/0125608 A1 | 5/2017 | Lu et al. | |

OTHER PUBLICATIONS

Office Action dated Oct. 22, 2018 in TW Application No. 107115562.

* cited by examiner

*Primary Examiner* — Mark V Prenty
(74) *Attorney, Agent, or Firm* — Muncy, Geissler, Olds & Lowe, P.C.

(57) ABSTRACT

A semiconductor device includes a semiconductor substrate having a first conductivity type; a deep well region disposed on the semiconductor substrate, and having a second conductivity type opposite to the first conductivity type; a first well region and a second well region disposed in the deep well region and having the first conductivity type, wherein the first well region and the second well region are separated by a portion of the deep well region, and the first well region is electrically connected to the second well region; and a first doped region and a second doped region disposed in the deep well region and having the second conductivity type, wherein the first well region and the second well region are located between the first doped region and the second doped region.

17 Claims, 5 Drawing Sheets

SEMICONDUCTOR DEVICE

CROSS-REFERENCE TO RELATED APPLICATION

This application claims the benefit of Taiwan Patent Application No. 107115562, filed on May 8, 2018, in the Taiwan Intellectual Property Office, the disclosure of which is incorporated herein in its entirety by reference.

BACKGROUND OF THE INVENTION

1. Field of the Invention

The present invention relates to a semiconductor device, and more particularly to a semiconductor device of a junction field effect transistor (JFET).

2. Description of the Related Art

In the semiconductor industry, there are two main types of field effect transistors (FETs), one is the insulated gate field effect transistor (IGFET) which is commonly referred to as a metal oxide semiconductor field effect transistor (MOSFET), and the other is the junction field effect transistor (JFET). The structures of the MOSFET and the JFET are basically different. For example, a gate of the MOSFET includes an insulating layer (that is, a gate oxide layer) disposed between the gate electrode and other electrodes. Therefore, the current in the channel formed in the MOSFET is controlled by the electric field applied through the channel, so as to enhance or deplete the channel as required. The gate and the other electrodes of the JFET form a P-N junction, and the P-N junction can be reverse biased by applying a predetermined gate voltage. Therefore, by changing the size of the depletion region in the channel of the JFET, the channel current of the JFET can be controlled.

In general, the JFET can be used as a voltage-controlled resistor or an electronic control switch. The P-type JFET includes a channel having doped semiconductor material with a large number of positively-charged carriers or holes, and the N-type JFET includes a channel having doped semiconductor materials with a large number of negatively-charged carriers or electrons. The JFET has a source and a drain formed on its two ends by ohmic contact, and current flows through the channel between the source and the drain. In addition, the current can be blocked or controlled by applying a reverse biased voltage to the gate, and this operation is also referred as a pinch-off operation.

Although the existing semiconductor device of JFET and the manufacturing method thereof have gradually satisfied some intended purposes, they have not completely met requirements in all applications. Therefore, the semiconductor device of JFET and manufacturing techniques thereof still have some problems that need to be overcome.

SUMMARY OF THE INVENTION

The present invention provides an embodiment of the semiconductor device, and more particularly an embodiment of a JFET. By adjusting the doping concentrations of a well regions of the JFET in the manufacturing process, the JFET can have a specific pinch-off voltage to meet the requirements of different product applications. However, it is not easy to precisely control the doping concentrations of the well regions, which result in a non-negligible deviation between the anticipated and actual pinch-off voltages of the JFET.

In order to more precisely control the pinch-off voltage of the JFET, in some embodiments of the present invention, the JFET includes a plurality of well regions disposed between the doped regions which are electrically connected to the source and the drain (that is, the source region and the drain region), respectively. The conductivity type of these well regions is opposite to the conductivity type of the source region and the drain region, and each two adjacent well regions are spaced apart by a distance, which has a positive linear relation with the pinch-off voltage of the JFET. That is, when the distance is longer, the JFET has a higher pinch-off voltage. In general, the pinch-off voltage of the JFET is determined by the shortest distance, (that is, the pinch-off voltage is directly related to the shortest distance). Furthermore, by disposing the plurality of well regions between the source region and the drain region and spacing apart any two well regions by different distances, the pinch-off voltage of the JFET can be controlled more precisely, and the leakage current of the JFET can be reduced, and the conductive path from the drain region to the source region can be extended to further increase the operation voltage.

According to some embodiments, the present invention provides a semiconductor device which comprises a semiconductor substrate having a first conductivity type, a deep well region disposed on the semiconductor substrate and having a second conductivity type opposite to the first conductivity type. The semiconductor device includes a first well region and a second well region disposed in the deep well region, and having the first conductivity type, wherein the first well region and the second well region are separated by a portion of the deep well region, and the first well region is electrically connected to the second well region. The semiconductor device includes a first doped region and a second doped region disposed in the deep well region and having the second conductivity type. The first well region and the second well region are located between the first doped region and the second doped region.

According to some embodiments, the present invention provides a semiconductor device. The semiconductor device comprises a semiconductor substrate, a deep well region, a first well region, a first doped region, a second doped region, and a third doped region. The semiconductor substrate has a first conductivity type. The deep well region is disposed on the semiconductor substrate. The deep well region has a second conductivity type, which is opposite to the first conductivity type. The first well region is disposed on the semiconductor substrate and surrounds the deep well region. The first well region has the first conductivity type. From a top view, the first well region comprises an extension part that extends into the deep well region. The first doped region, the second doped region, and the third doped region are disposed in the deep well region and have the second conductivity type. From a top view, the first doped region is disposed on an extension line of the extension part, and the second doped region and the third doped region are disposed at two sides of the extension part, respectively. The second doped region and the third doped region are separated by the extension part.

BRIEF DESCRIPTION OF THE DRAWINGS

The semiconductor device of the present invention can be applied to various types of semiconductor devices. The structure, operating principle and effects of the present disclosure will be described in detail by way of various embodiments which are illustrated in the accompanying drawings.

FIG. 1A is the schematic cross-sectional view of the semiconductor device taken along line A-A' of FIG. 1C, and FIG. 1B is the schematic cross-sectional view of the semiconductor device taken along line B-B' of FIG. 1C.

DETAILED DESCRIPTION OF THE PREFERRED EMBODIMENTS

Figure 1A:
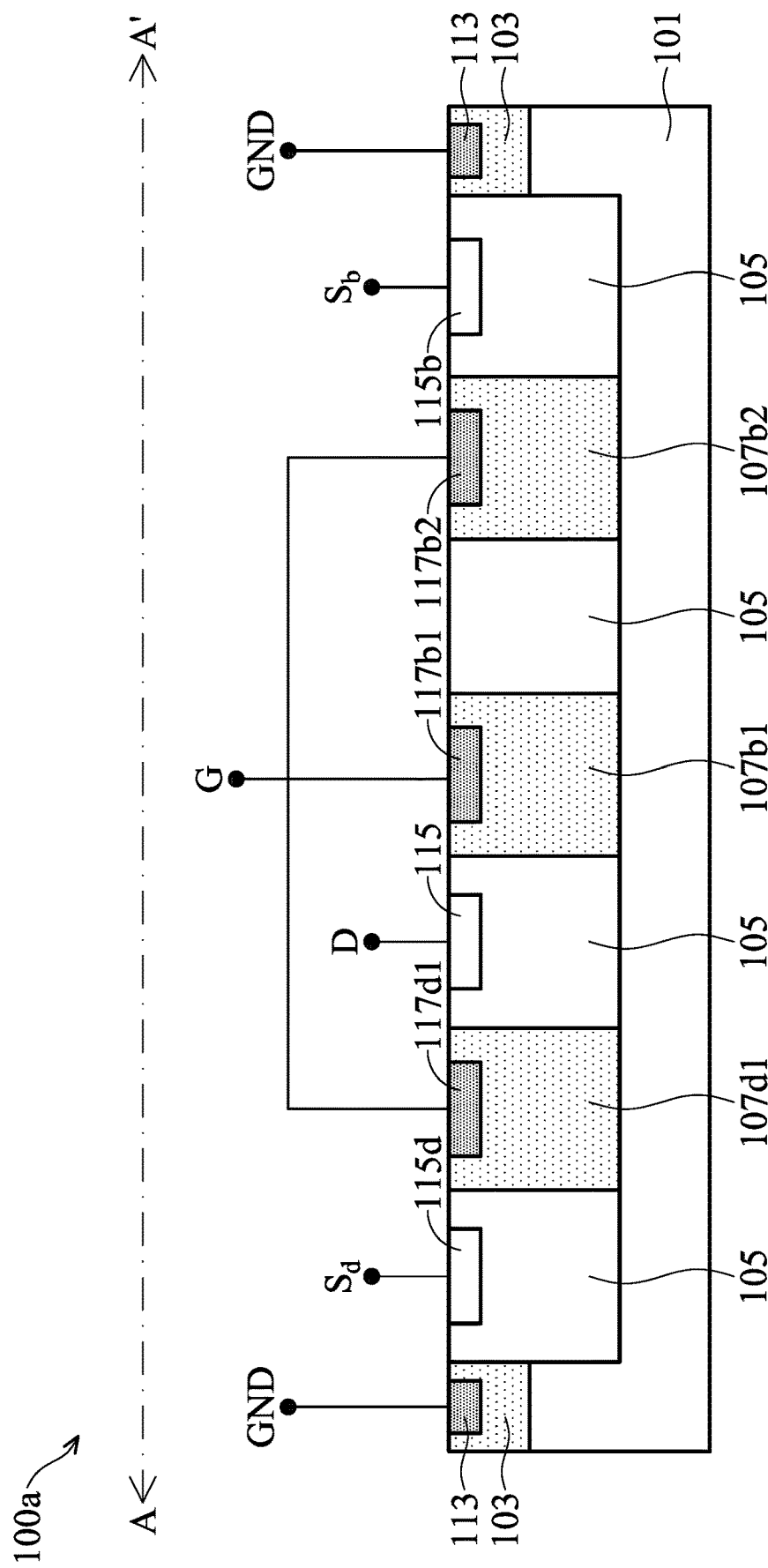
FIG. 1A is a schematic cross-sectional view of a semiconductor device of an embodiment of the present invention.

The following embodiments of the present disclosure are herein described in detail with reference to the accompanying drawings. These drawings show specific examples of the embodiments of the present disclosure. It should be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It should be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It should be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 1B:
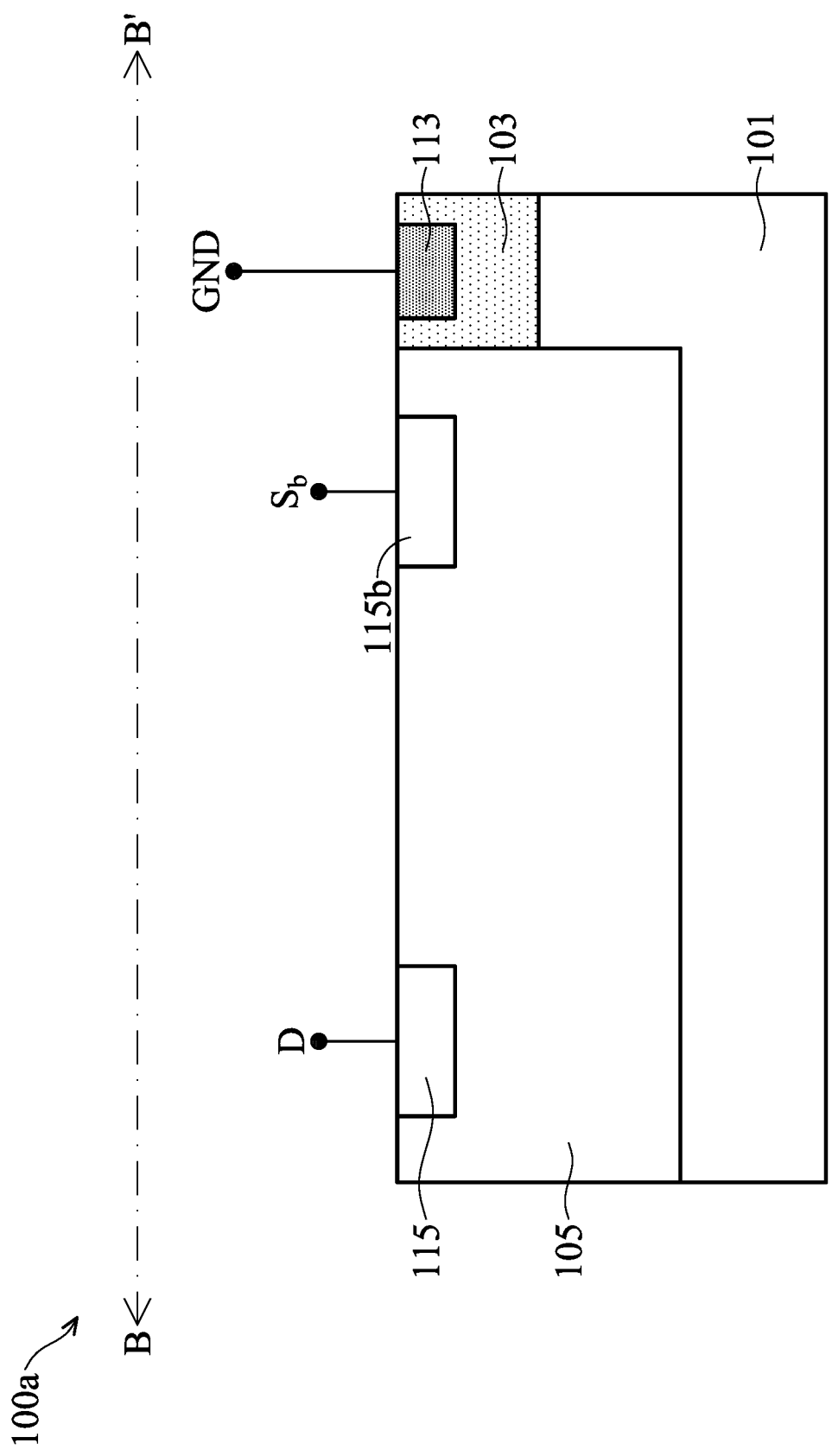
FIG. 1B is a schematic cross-sectional view of a semiconductor device of an embodiment of the present invention.
Figure 1C:
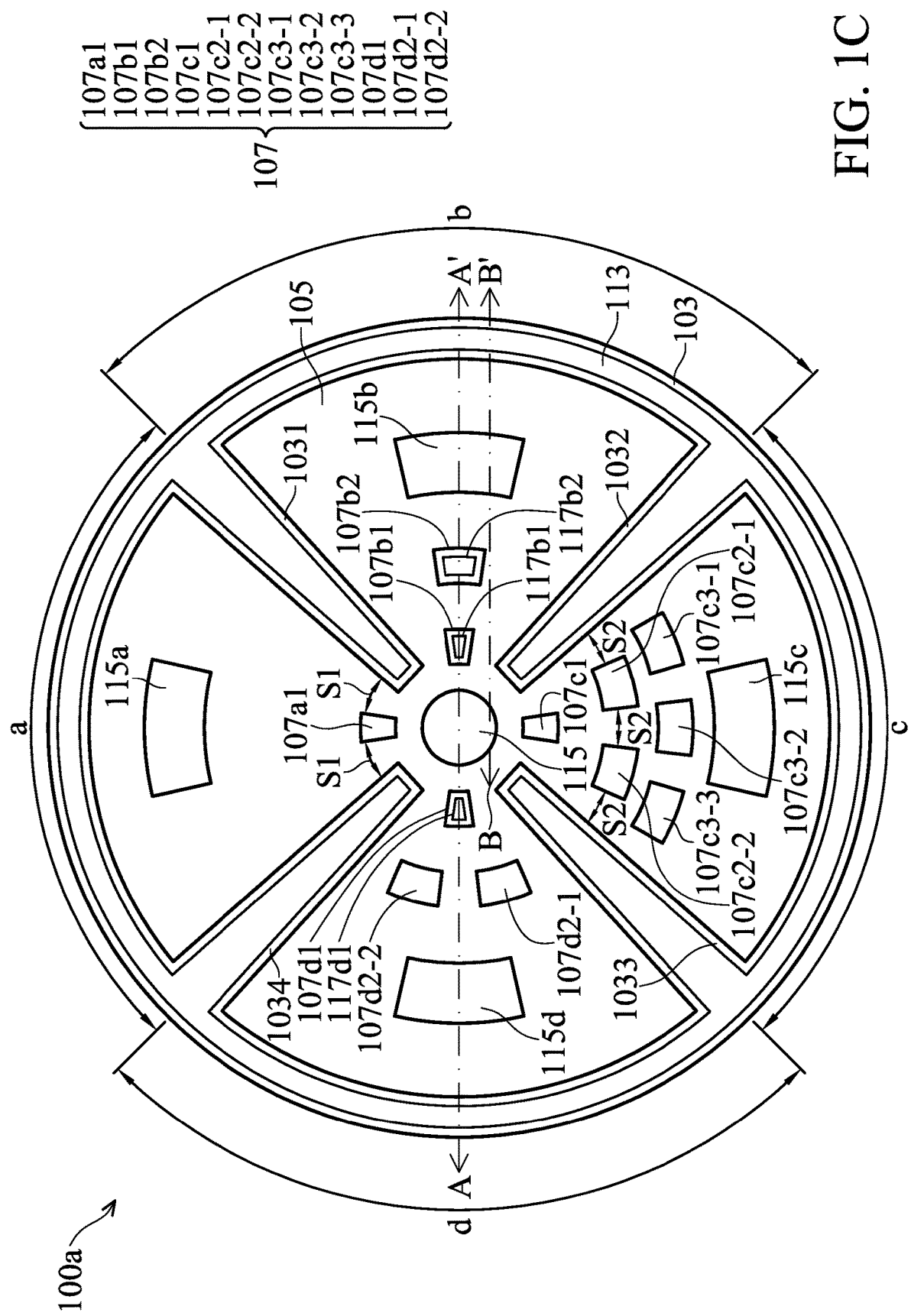
FIG. 1C is a schematic cross-sectional view of a semiconductor device of an embodiment of the present invention.

FIG. 1A is a schematic cross-sectional view of a semiconductor device 100a of an embodiment of the present invention. FIG. 1B is a schematic cross-sectional view of the semiconductor device 100a different from FIG. 1A. FIG. 1C is a schematic cross-sectional view of a semiconductor device 100a of an embodiment of the present invention, for displaying the top view of the semiconductor device 100a. FIG. 1A is the schematic cross-sectional view of the semiconductor device 100a taken along line A-A' of FIG. 1C. FIG. 1B is the schematic cross-sectional view of the semiconductor device 100a taken along line B-B' of FIG. 1C.

According to some embodiments, as shown in FIG. 1C, the semiconductor device 100a includes four regions a, b, c and d, and each of the regions a, b, c and d includes a semiconductor component, such as a JFET. In some embodiments, FIG. 1A shows a cross-sectional view taken from the region d to the region b, and two JFETs are shown in FIG. 1A; and, FIG. 1B shows a cross-sectional view of the region b that is different from the FIG. 1A. FIG. 1C shows the semiconductor device 100a including four semiconductor components, but the number of the semiconductor components included in the semiconductor device 100a is not limited thereto. In other implementations, the semiconductor device 100a can be divided into at least one region upon demand, and each region corresponds to at least one semiconductor component.

Please referring to FIGS. 1A, 1B and 1C. The semiconductor device 100a comprises a semiconductor substrate 101. The semiconductor substrate 101 can be made by silicon or other semiconductor material; alternatively, the semiconductor substrate 101 may include other elementary semiconductor material, such as germanium (Ge). In some embodiments, the semiconductor substrate 101 can be made by compound semiconductor, such as silicon carbide, gallium nitride, gallium arsenide, indium arsenide or indium phosphide. In some embodiments, the semiconductor substrate 101 can be made by alloy semiconductor, such as silicon-germanium, silicon germanium carbide, gallium arsenic phosphide or gallium indium phosphide.

In some embodiments, the semiconductor substrate 101 can be lightly doped P-type or N-type substrate. In this embodiment, the semiconductor substrate 101 can be the P-type and have P-type dopants (such as boron (B)) inside, and the semiconductor device 100a formed on the semiconductor substrate 101 may include an N-type JFET. Furthermore, an epitaxial layer can be disposed on the semiconductor substrate 101, and the epitaxial layer has the opposite conductivity type of the semiconductor substrate 101, for example, an N-type epitaxial layer can be disposed on a P-type semiconductor substrate 101.

The semiconductor device 100a includes a deep well region 105 disposed on the semiconductor substrate 101 and having the opposite conductivity type of the semiconductor substrate 101. In detail, the deep well region 105 can be disposed in the semiconductor substrate 101 close to the top surface of the semiconductor substrate 101. In some embodiments, the top surface of the deep well region 105 and the top surface of the semiconductor substrate 101 can be coplanar.

In order to form the deep well region 105, a patterned photoresist (not shown in figures) is formed on the semiconductor substrate 101, and N-type or P-type dopants are implanted into the semiconductor substrate 101 using a patterned photoresist as a mask, so as to form the deep well region 105 in at least one portion of the semiconductor substrate 101 not covered by the patterned photoresist. Next, the patterned photoresist is removed. In other implementations, the deep well region 105 can be disposed in the epitaxial layer on the semiconductor substrate 101, and the doping concentration of the deep well region 105 can be higher than the doping concentration of the epitaxial layer.

In this embodiment, the deep well region 105 can be the N-type and have an N-type dopant (such as phosphorus (P) or arsenic (As)) inside.

Furthermore, the semiconductor device 100a includes a well region 103 disposed on the semiconductor substrate 101 and surrounding the deep well region 105. The well region 103 has the opposite conductivity type of the deep well region 105, and the well region 103 is electrically connected to the ground. In some embodiments, the doping concentration of the well region 103 is about $1\times10^{12}$ atom/cm$^3$ to about $8\times10^{13}$ atom/cm$^3$, and the doping concentration of the well region 103 can be determined upon an anticipated pinch-off voltage of the semiconductor device 100a.

In detail, the well region 103 is disposed in the semiconductor substrate 101 and close to the top surface of the semiconductor substrate 101. In some embodiments, the top surface of the well region 103 and the top surface of the semiconductor substrate 101 are coplanar, and the well region 103 is disposed adjacent to the deep well region 105.

In some embodiments, as shown in FIGS. 1A and 1B, the bottom surface of the well region 103 is higher than the bottom surface of the deep well region 105. That is, a side wall of the well region 103 is in contact with an upper part of a side wall of the deep well region 105, and a lower part of a side wall of the deep well region 105 is in contact with the semiconductor substrate 101. In some other embodiments, the bottom surface of the well region 103 and the bottom surface of the deep well region 105 can be coplanar.

In some embodiments, the well region 103 and the deep well region 105 can be disposed in the epitaxial layer on the semiconductor substrate 101, and the bottom surfaces of the well region 103 and the bottom surface of the deep well region 105 are in contact with the top surface of the semiconductor substrate 101. Furthermore, a portion of the epitaxial layer can be maintained with the original doping concentration; in other words, the well region 103 and the deep well region 105 can be formed in a portion of the epitaxial layer, and another portion of the epitaxial layer can be maintained with the original doping concentration which is lower than that of the well region 103 and the deep well region 105, so that the manufactured semiconductor device 100a can have a higher withstanding voltage, such as a withstanding voltage in a range of about 200 volts to about 500 volts.

The well region 103 includes a doped region 113 disposed inside and having the same conductivity type as that of the well region 103, and the doping concentration of the doped region 113 is higher than the doping concentration of the well region 103. In this embodiment, the well region 103 and the doped region 113 both are P-type.

In the top view of FIG. 1C, the semiconductor device 100a includes a first doped region 115 disposed at a central portion thereof, and the well region 103 comprises extension parts 1031, 1032, 1033 and 1034 extending into the deep well region 105. In other words, the first doped region 115 is disposed in the central portion of the deep well region 105, and extension parts 1031, 1032, 1033 and 1034 are extended towards to the first doped region 115. That is, the first doped region 115 is disposed on an extension line of any of the extension parts 1031, 1032, 1033 and 1034. In this embodiment, the semiconductor device 100a is divided into four regions a, b, c and d according to the four extension parts 1031, 1032, 1033 and 1034; however, the number of extension parts and regions included in the semiconductor device of the present invention are not limited thereto.

In some embodiments, the first doped region 115 is disposed in the deep well region 105. Furthermore, a second doped region 115a is disposed in the deep well region 105 of the region a, a third doped region 115b is disposed in the deep well region 105 of the region b, a fourth doped region 115c is disposed in the deep well region 105 of the region c, and a fifth doped region 115d is disposed in the deep well region 105 of the region d. The conductivity types of the first doped region 115, the second doped region 115a, the third doped region 115b, the fourth doped region 115c and the fifth doped region 115d are the same as that of the deep well region 105, for example, all are N-type, and the doping concentrations of the first doped region 115, the second doped region 115a, the third doped region 115b, the fourth doped region 115c and the fifth doped region 115d are higher than that of the deep well region 105.

Please refer to FIGS. 1A and 1B. The semiconductor device 100a includes a drain electrode D which is a common drain for four semiconductor components (such as JFETs) and electrically connected to the first doped region 115. The semiconductor 100a includes four source electrodes of the four semiconductor components, and these four source electrodes are electrically connected to the second doped region 115a, the third doped region 115b, the fourth doped region 115c and the fifth doped region 115d, respectively. For example, the source electrodes can be the source electrode $S_d$ in the region d shown in FIG. 1A, or the source electrode $S_b$ in the region b shown in FIGS. 1A and 1B.

Please refer to FIG. 1C. It should be noted that well regions 107 having the conductivity type opposite to that of the deep well region 105 are disposed in the deep well region 105. The well regions 107 can include well regions 107a1, 107b1, 107b2, 107c1, 107c2-1, 107c2-2, 107c3-1, 107c3-2, 107c3-3, 107d1, 107d2-1 and 107d2-2. In detail, in the region a, the well region 107a1 is disposed between the first doped region 115 and the second doped region 115a, in the region b, the well regions 107b1 and 107b2 are disposed between the first doped region 115 and the third doped region 115b, and the well region 107b1 is closer to the first doped region 115 than the well region 107b2.

In the region c, the well regions 107c1, 107c2-1, 107c2-2, 107c3-1, 107c3-2 and 107c3-3 are disposed between the first doped region 115 and the fourth doped region 115c, and among the well regions 107c1, 107c2-1, 107c2-2, 107c3-1, 107c3-2 and 107c3-3, the well region 107c1 is closest to the first doped region 115, and the well region 107c2-1 and 107c2-2 are disposed on a circumference of a circle, the center of the circle is the center of the first doped region 115, and the well region 107c3-2 is closest to the fourth doped region 115c, and the well regions 107c3-1, 107c3-2 and 107c3-2 are disposed on a circumference of a circle, the center of the circle is the center of the first doped region 115. In the region d, the well regions 107d1, 107d2-1, and 107d2-2 are disposed between the first doped region 115 and the fifth doped region 115d, and the well region 107d1 is closest to the first doped region 115, and the well regions 107d2-1 and 107d2-2 are disposed on a circumference of a circle, the center of the circle is the center of the first doped region 115.

In this embodiment, the semiconductor device 100a includes twelve well regions 107 disposed in the deep well region 105 and having the opposite conductivity type to that of the deep well region 105, for example, in this embodiment, the conductivity type of each well region is P-type. However, the number of well regions 107 in the semiconductor device 100a is not limited to the example above. In other embodiments, each of the regions a to d can include at least one well region 107. Furthermore, the locations of the well regions 107 are not limited to example above. In other embodiments, the well region 107 can be disposed on any location between the first doped region 115 and the second doped region 115a, between the first doped region 115 and the third doped region 115b, between the first doped region 115 and the fourth doped region 115c, or between the first doped region 115 and the fifth doped region 115d.

Each of the well regions 107 can include a doped region inside, and the doped regions in the well region 107 can have the same conductivity type as the well regions 107, and the doping concentrations of the doped regions can be higher than that of the well regions 107. For example, the doped region 117d1 is disposed in the well region 107d1, the doped region 117b1 is disposed in the well region 107b1, and the doped region 117b2 is disposed in the well region 107b2. In some embodiments, other well regions 107 may also include a doped region. For the sake of simplicity, FIG. 1C does not show all doped regions in the well regions 107.

Please refer to FIGS. 1A and 1C. The well region 107d1 in the region d, the well regions 107b1 and the well region 107b2 in the region b are electrically connected to the gate electrode G, the well region 103 is electrically connected to the ground, the gate electrode G and the well region 103 are not electrically connected. However, in another embodiment, the gate electrode G and the well region 103 can be electrically connected to each other. That is, both the gate electrode G and the well region 103 are electrically connected to ground.

In some embodiments, the gate electrode G can be electrically connected to the well region 107a1 in the region a, and the well regions 107c1, 107c2-1, 107c2-2, 107c3-1, 107c3-2 and 107c3-3 in the regions c. In other words, the gate electrode G is electrically connected to all well regions 107 in the deep well region 105. However, the electrical connection between the gate electrodes in the regions a, b, c and d is not limited thereto, and can be adjusted upon application of the semiconductor device.

In the region a, extension parts 1031 and 1034 are extended between the first doped region 115 and the second doped region 115a, the well region 107a1 is disposed between the first doped region 115 and the second doped region 115a. The distance S1 between the well region 107a1 and the extension part 1034 and the distance S1 between the well region 107a1 and the extension part 1031 can be used for pinch-off operation of the semiconductor component in the region a, so as to block current flowing from the drain electrode D into the second doped region 115a and the source electrode through the first doped region 115.

It should be noted that, the pinch-off voltage of the semiconductor component in the region a relates to the distance S1. When the distance S1 is shorter, the pinch-off voltage is lower. That is, the semiconductor components may be pinched off more easily. In detail, the pinch-off voltage of the semiconductor components in region a is determined by the distance S1. That is, the pinch-off voltage directly related to the distance S1.

In the region c, extension parts 1032 and 1033 are extended between the first doped region 115 and the fourth doped region 115c, and the well regions 107c1, 107c2-1, 107c2-2, 107c3-1, 107c3-2 and 107c3-3 are disposed between the first doped region 115 and the fourth doped region 115c. The well regions 107c1, 107c2-1, 107c2-2, 107c3-1, 107c3-2 and 107c3, and the extension parts 1032 and 1033 can be used to pinch off the semiconductor component in the region c. The pinch-off voltage of the semiconductor component in the region c relates to a distance between each two of the well regions 107c1, 107c2-1, 107c2-2, 107c3-1, 107c3-2 and 107c3-3 and the extension parts 1032 and 1033, such as the distance S2 between the well region 107c2-1 and the well region 107c2-2.

The plurality of well regions 107c1, 107c2-1, 107c2-2, 107c3-1, 107c3-2 and 107c3-3 are disposed in the region c, and the well regions 107c2-1 and 107c2-2 are disposed on a circumference of a circle, the center of the circle is the center of the first doped region 115, and the well regions 107c3-1, 107c3-2 and 107c3-3 are disposed on other circumference of the circle, the center of the circle is the center of the first doped region 115, so it is easier to completely block the current flowing from the drain electrode D into the fourth doped region 115c and source electrode through the first doped region 115; in other words, it is easier to completely pinch off the semiconductor component in the region c, to prevent current leakage.

The pinch-off mechanism of the semiconductor components in the region b and the region d are the same or similar to that of the semiconductor components in the region a and the region c, so the descriptions are not repeated. Furthermore, FIG. 1A is a cross-sectional view of the semiconductor device 100a taken through the gate electrode, and FIG. 1B is a cross-sectional view of the semiconductor device 100a not taken through the gate electrode. That is, FIG. 1B shows the cross-sectional view of the current path when the JFET is turned on.

Furthermore, in some embodiments, in order to form the drain electrode D, the source electrode including the source electrodes $S_d$ and $S_b$, and the gate electrode G, an interlayer dielectric layer (ILD) can be formed on the semiconductor substrate 101. An electric conductive structure (such as conductive layers and vias) is formed in the interlayer dielectric layer, so as to electrically connect the doped regions in the semiconductor substrate 101 to the electrodes above the doped regions.

Figure 2:
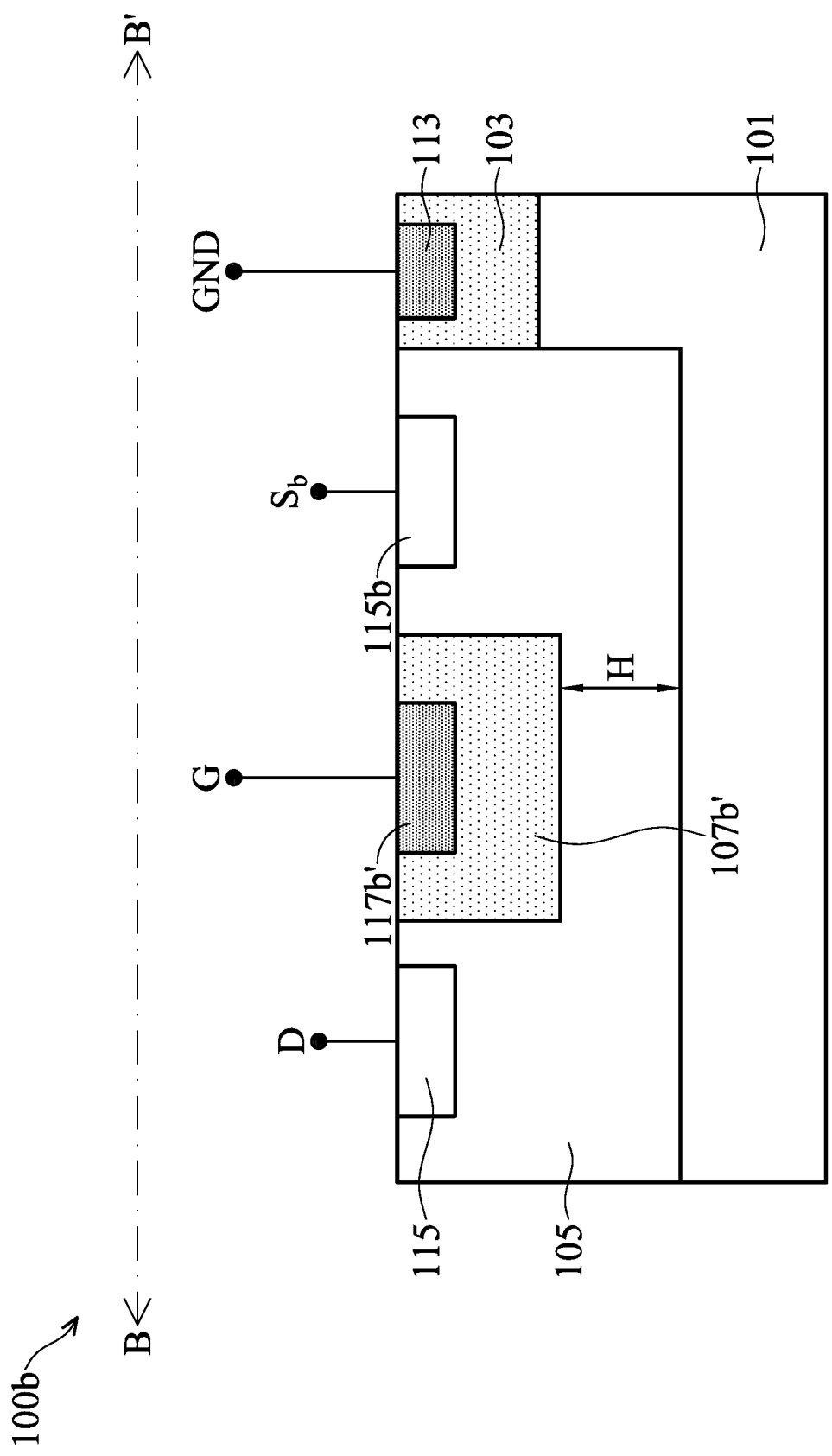
FIG. 2 is a schematic cross-sectional view of a semiconductor device according to another embodiment of the present invention.

FIG. 2 is a cross-sectional view of the semiconductor device 100b according to other embodiments of the present invention. It should be noted that the cross-sectional direction of FIG. 2 is equal to the cross-sectional direction of FIG. 1B; in other words, FIG. 2 and FIG. 1B both shows cross-sectional views of one of the semiconductor components (such as a JFET) of the semiconductor device.

The difference between FIG. 2 and FIG. 1B is that the cross-sectional view of FIG. 2 is taken through the gate electrode G of the semiconductor device 100b, and the gate electrode G is electrically connected to the well region 107b' and the doped region 117b' in the well region 107b'. The well region 107b' and the doped region 117b' have the same conductivity type (such as P-type), and the doping concentration of the doped region 117b' is higher than the doping concentration of the well region 107b'.

It should be noted that the bottom surface of the well region 107b' is higher than the bottom surface of the deep well region 105; in other words, in an embodiment of FIG. 2, the well region 107b' is a shallow well region. Furthermore, the doping concentration of the well region 107b' is higher than the doping concentration of the well region 103. The bottom surfaces of the well region 107b' and the deep well region 105 are spaced apart by a distance H, so when the gate electrode G is electrically connected to the electrode, the distance H can be used to pinch off the semiconductor component in the region b. In some embodiments, the distance H is less than about 3 μm, and can be determined upon the anticipated pinch-off voltage of the semiconductor device 100b.

Compared with the semiconductor device 100a shown in FIGS. 1A to 1C, the semiconductor device 100b shown in FIG. 2 is designed with a distance (such as the distance H)

in a direction perpendicular to the top surface of the semiconductor substrate 101, so the pinch-off voltage of the semiconductor component of the semiconductor device 100b can be controlled more precisely. On the other hand, in the semiconductor device 100a, only the distance in parallel with the top surface of the semiconductor substrate 101 can be adjusted, so the semiconductor component of the semiconductor device 100a can be pinched off more easily than the semiconductor device 100b.

Figure 3:
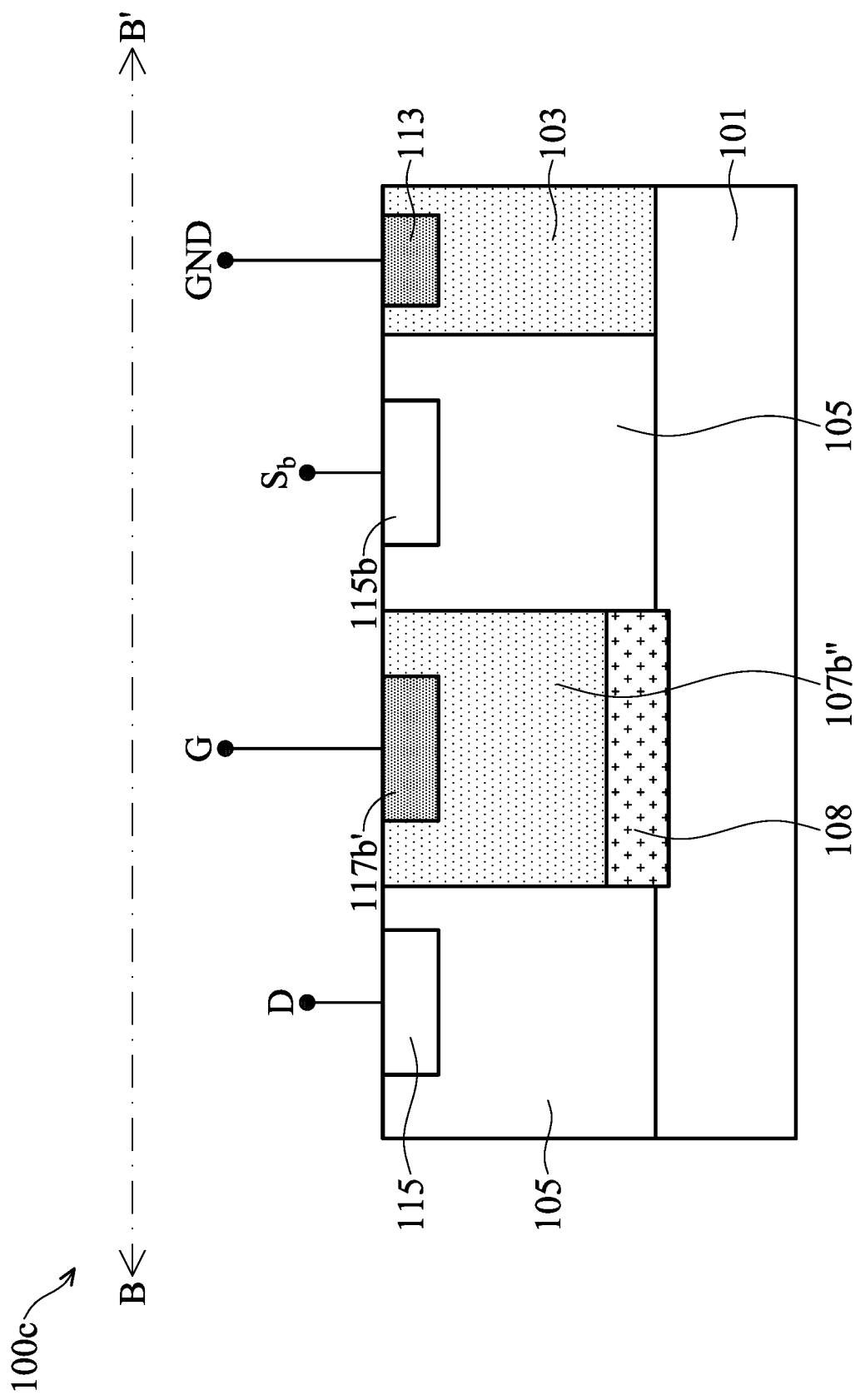
FIG. 3 is a schematic cross-sectional view of a semiconductor device according to an alternative embodiment of the present invention.

FIG. 3 is a cross-sectional view of a semiconductor device 100c according to an alternative embodiment of the present invention. It should be noted that the cross-sectional direction of FIG. 3 is equal to the cross-sectional direction of FIG. 2; in other words, FIGS. 2 and 3 both show cross-sectional views of a semiconductor component of the semiconductor device.

The difference between FIG. 3 and FIG. 2 is that the semiconductor device 100c of FIG. 3 includes a buried layer 108 disposed between the well region 107b" and the semiconductor substrate 101. In some embodiments, the buried layer 108 is sandwiched between the well region 107b" and the semiconductor substrate 101, and the width of the buried layer 108 is substantially equal to the width of the well region 107b", for example, the width is in a range of about 2 µm to about 10 µm. Furthermore, the buried layer 108 has the same conductivity type as the well region 107b" and the semiconductor substrate 101, for example, P-type. The bottom surface of the buried layer 108 is lower than the bottom surface of the deep well region 105.

In the semiconductor device 100c shown in FIG. 3, the current can be almost completely blocked in the direction perpendicular to the top surface of the semiconductor substrate 101, so the semiconductor component of the semiconductor device 100c can be pinched off more easily, compared with the semiconductor device 100a.

The present invention provides an embodiment of the semiconductor device, more particularly to an embodiment of a JFET. Generally, by adjusting the doping concentrations of the well regions of the JFET during the manufacturing process, the JFET can have a specific pinch-off voltage to meet the demands of different product applications. However, it is not easy to precisely control the doping concentrations of the well regions, which result in a non-negligible deviation between the anticipated and actual pinch-off voltages of the JFET.

According to some embodiments of the present invention, in order to more precisely control the pinch-off voltage of the JFET, the JFET can include a plurality of well regions disposed between the doped regions electrically connected to the source electrode and the drain electrode, and the doped regions are also called source region and drain region, and the conductivity type of these well regions is opposite to the conductivity type of the source region and the drain region, and each two adjacent well regions are spaced apart by a distance, which has a positive linear relation with the pinch-off voltage of the JFET. That is, when the distance is longer, the JFET has a higher pinch-off voltage. In general, the pinch-off voltage of the JFET is determined by the shortest distance. That is, the pinch-off voltage is directly related to the shortest distance. Furthermore, by disposing the plurality of well regions between the source region and the drain region and spacing apart any two well regions by different distances, the pinch-off voltage of the JFET can be controlled more precisely, and the leakage current of the JFET can be reduced; furthermore, the conductive path between the drain region and the source region can also be extended, thereby improving the operation voltage of the JFET.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A semiconductor device, comprising:
   a semiconductor substrate having a first conductivity type;
   a deep well region disposed on the semiconductor substrate and having a second conductivity type opposite to the first conductivity type;
   a first well region and a second well region disposed in the deep well region and having the first conductivity type, wherein the first well region and the second well region are separated by a portion of the deep well region, and the first well region is electrically connected to the second well region;
   a first doped region and a second doped region disposed in the deep well region and having the second conductivity type, wherein the first well region and the second well region are located between the first doped region and the second doped region; and
   a drain electrode, a source electrode and a gate electrode disposed on the semiconductor substrate, wherein the drain electrode is electrically connected to the first doped region, the source electrode is electrically connected to the second doped region, and the gate electrode is electrically connected to the first well region and the second well region.

2. The semiconductor device as claimed in claim 1, wherein bottom surfaces of the deep well region, the first well region and the second well region are coplanar.

3. The semiconductor device as claimed in claim 1, further comprising:
   a third well region disposed on the semiconductor substrate and surrounding the deep well region, wherein the third well region has the first conductivity type and is electrically connected to ground.

4. The semiconductor device as claimed in claim 3, wherein the first well region and the second well region are electrically connected to the third well region.

5. The semiconductor device as claimed in claim 3, wherein, from a top view, the second well region is an extension part of the third well region extended towards the first doped region.

6. The semiconductor device as claimed in claim 3, wherein a bottom surface of the first well region is higher than a bottom surface of the deep well region.

7. The semiconductor device as claimed in claim 1, comprising:
   a buried layer disposed between the first well region and the semiconductor substrate, wherein the buried layer has the first conductivity type, and a bottom surface of the buried layer is lower than or coplanar with a bottom surface of the deep well region.

8. The semiconductor device as claimed in claim 1, further comprising:
   an epitaxial layer disposed on the semiconductor substrate and having the second conductivity type, wherein the deep well region is disposed in the epitaxial layer, and a doping concentration of the deep well region is higher than a doping concentration of the epitaxial layer.

9. A semiconductor device, comprising:
   a semiconductor substrate having a first conductivity type;

a deep well region disposed on the semiconductor substrate, and having a second conductivity type opposite to the first conductivity type;

a first well region disposed on the semiconductor substrate and surrounding the deep well region, wherein the first well region has the first conductivity type, and in a top view, the first well region comprises an extension part extended into the deep well region; and a first doped region, a second doped region and a third doped region disposed inside the deep well region and having the second conductivity type, wherein from the top view, the first doped region is disposed on an extension line of the extension part, the second doped region and the third doped region are disposed at opposite sides of the extension part, and the second doped region and the third doped region are separated by the extension part.

10. The semiconductor device as claimed in claim 9, further comprising:

a drain electrode, a first source electrode and a second source electrode disposed on the semiconductor substrate, wherein the drain electrode is electrically connected to the first doped region, the first source electrode is electrically connected to the second doped region, and the third source electrode is electrically connected to the third doped region.

11. The semiconductor device as claimed in claim 9, further comprising:

a second well region and a third well region disposed inside the deep well region and having the first conductivity type, wherein, in a top view, the second well region and the third well region are disposed at opposite sides of the extension part, and the second well region and the third well region are separated from the extension part.

12. The semiconductor device as claimed in claim 11, wherein the second well region is located between the first doped region and the second doped region, and the third well region is located between the first doped region and the third doped region.

13. The semiconductor device as claimed in claim 11, further comprising:

a gate electrode disposed on the semiconductor substrate, wherein the gate electrode is electrically connected to the second well region and the third well region.

14. The semiconductor device as claimed in claim 13, wherein the gate electrode and the first well region are electrically connected to ground.

15. A semiconductor device, comprising:

a semiconductor substrate having a first conductivity type;

a deep well region disposed on the semiconductor substrate and having a second conductivity type opposite to the first conductivity type;

a first well region and a second well region disposed in the deep well region and having the first conductivity type, wherein the first well region and the second well region are separated by a portion of the deep well region, and the first well region is electrically connected to the second well region;

a first doped region and a second doped region disposed in the deep well region and having the second conductivity type, wherein the first well region and the second well region are located between the first doped region and the second doped region; and a third well region disposed on the semiconductor substrate and surrounding the deep well region, wherein the third well region has the first conductivity type and is electrically connected to ground, wherein the first well region and the second well region are electrically connected to the third well region.

16. The semiconductor device as claimed in claim 15, wherein, from a top view, the second well region is an extension part of the third well region extended towards the first doped region.

17. The semiconductor device as claimed in claim 15, wherein a bottom surface of the first well region is higher than a bottom surface of the deep well region.

* * * * *